(12) United States Patent
Kimura et al.

(10) Patent No.: US 6,935,932 B2
(45) Date of Patent: Aug. 30, 2005

(54) POLISHING APPARATUS AND METHOD

(75) Inventors: Norio Kimura, Fujisawa (JP); Mitsuhiko Shirakashi, Fujisawa (JP); Katsuya Okumura, Tokyo (JP); You Ishii, Yokohama (JP); Junji Kunisawa, Yamato (JP); Hiroyuki Yano, Yokohama (JP)

(73) Assignees: Ebara Corporation, Tokyo (JP); Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 10/784,945

(22) Filed: Feb. 25, 2004

(65) Prior Publication Data

US 2004/0166783 A1 Aug. 26, 2004

Related U.S. Application Data

(62) Division of application No. 09/824,644, filed on Apr. 4, 2001, now Pat. No. 6,722,964.

(30) Foreign Application Priority Data

Apr. 4, 2000 (JP) ........................................ 2000-102669
May 31, 2000 (JP) ........................................ 2000-163082

(51) Int. Cl.⁷ ................................................ B24B 1/00
(52) U.S. Cl. ............................ 451/44; 451/41; 451/36
(58) Field of Search ............................ 451/36, 41, 44, 451/60, 63, 65, 285, 287, 242, 246, 254, 258, 446

(56) References Cited

U.S. PATENT DOCUMENTS 5,149,337 A 9/1992 Watanabe
5,274,959 A 1/1994 Dyer et al.
5,454,748 A 10/1995 Gottschald
5,882,539 A 3/1999 Hasegawa et al.
5,885,135 A 3/1999 Desorcie et al.
6,066,565 A 5/2000 Kuroki et al.
6,093,087 A 7/2000 Hakomori et al.
6,102,777 A 8/2000 Duescher et al.
6,162,730 A 12/2000 Kai et al.
6,234,879 B1 5/2001 Hasegawa et al.
6,267,649 B1 7/2001 Lai et al.
6,352,927 B2 3/2002 Kishimoto

FOREIGN PATENT DOCUMENTS

| JP | 52-32668 | 3/1977 |
|---|---|---|
| JP | 52-44162 | 4/1977 |
| JP | 57-96766 | 6/1982 |
| JP | 59-58827 | 4/1984 |
| JP | 5-6881 | 1/1993 |
| JP | 6-315829 | 11/1994 |
| JP | 7-193030 | 7/1995 |
| JP | 11-33887 | 2/1999 |
| JP | 11-90801 | 4/1999 |
| JP | 11-104942 | 4/1999 |

*Primary Examiner*—Eileen P. Morgan
(74) *Attorney, Agent, or Firm*—Wenderoth, Lind & Ponack, L.L.P.

(57) ABSTRACT

A polishing apparatus and method has a function of polishing a surface of a film formed on a substrate to a flat mirror finish and a function of polishing unnecessary metal film such as copper film deposited on an outer peripheral portion of the substrate to remove such unnecessary metal film. The polishing apparatus comprises a surface polishing mechanism comprising a polishing table having a polishing surface and a top ring for holding the substrate and pressing the substrate against the polishing surface of the polishing table to thereby polish a surface of the substrate, and an outer periphery polishing mechanism for polishing an outer peripheral portion of the substrate.

7 Claims, 12 Drawing Sheets

F I G. 3
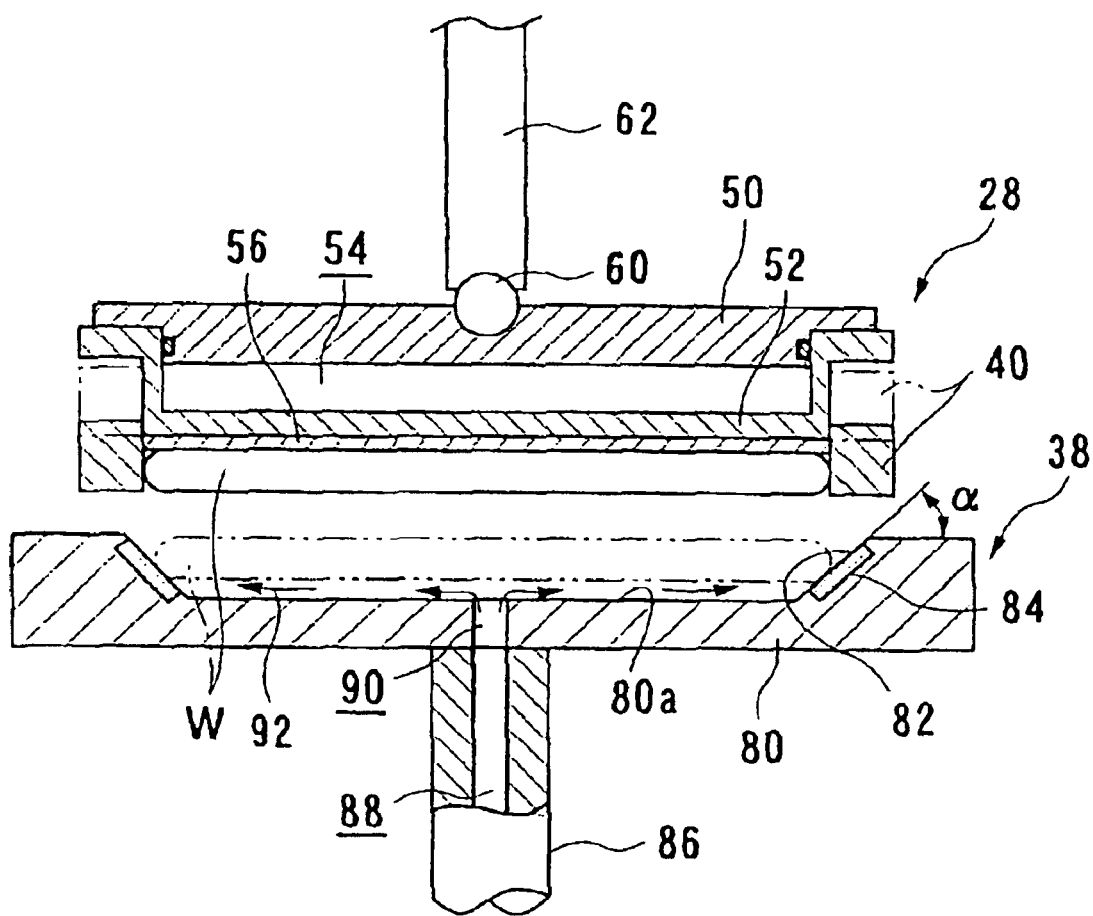

POLISHING APPARATUS AND METHOD

This is a Divisional application of U.S. application Ser. No. 09/824,644, filed Apr. 4, 2001 now U.S. Pat. No. 6,722,964.

BACKGROUND OF THE INVENTION

1. Field of the Invention

The present invention relates to a polishing apparatus and method for polishing a surface of a workpiece such as a semiconductor wafer, and more particularly to a polishing apparatus and method having a function of polishing a surface of a film formed on a substrate to a flat mirror finish and a function of polishing unnecessary metal film or the like, particularly copper (Cu) film, deposited on an outer peripheral portion of the substrate to remove such unnecessary metal film. The present invention also relates to an outer periphery polishing apparatus for polishing an outer peripheral portion of a substrate to remove unnecessary metal film or the like deposited on the outer peripheral portion of the substrate.

2. Description of the Related Art

Generally, aluminum or aluminum alloys have been used as a material for forming interconnects (interconnections or wiring) for a semiconductor substrate. However, in recent years, there has been a growing tendency to replace aluminum or aluminum alloys with copper having a low electric resistivity and a high electromigration resistance. Copper interconnects of this kind are generally formed by filling copper into minute trenches or via holes preformed in the surface of the substrate. As a means for filling copper into the minute trenches or via holes, there are various methods including CVD, sputtering, and plating, and in every method, copper is deposited over a substantially entire surface of the substrate, and then unnecessary copper is removed by a chemical mechanical polishing (CMP).

FIGS. 13A through 13C show successive steps of manufacturing copper interconnects in a substrate such as a semiconductor wafer. As shown in FIG. 13A, an oxide film 2 of SiO$_2$ is deposited on a conductive layer 1a on a semiconductor substrate 1 on which semiconductor devices are formed. Then, a via hole 3 and a trench 4 for a predetermined interconnect pattern are formed in the oxide film 2 by lithography and etching. Thereafter, a barrier layer 5 of TiN or TaN or the like is formed, and then a seed layer 7 to supply electric current for electroplating is formed on the barrier layer 5 by film deposition.

Then, as shown in FIG. 13B, the entire surface of the semiconductor substrate 1 is coated with copper by electroplating to deposit a copper layer 6 on the entire surface, thus filling the via hole 3 and the trench 4 with copper. Thereafter, the copper layer 6 on the barrier layer 5 and the barrier layer 5 are removed by chemical mechanical polishing (CMP), thus making the copper layer 6 in the via hole 3 and the trench 4 lie flush with the oxide film 2. In this manner, an interconnect composed of the copper layer 6 is produced as shown in FIG. 13C.

In this case, the barrier layer 5 is formed so as to cover substantially the entire surface of the oxide film 2, and the seed layer 7 is also formed so as to cover substantially the entire surface of the barrier layer 5. Thus, in some cases, as shown in FIG. 14, a sputtering film of copper which is the seed layer 7 resides in a bevel (outer peripheral portion) of the substrate W, or copper is deposited on an edge (outer peripheral portion) inwardly of the bevel and remains unpolished (not shown in FIG. 14).

Copper can easily be diffused into an oxide film in a semiconductor fabrication process such as annealing, thus deteriorating the electric insulation of the oxide film and impairing the adhesiveness of the oxide film with a film to be subsequently deposited to possibly cause separation of the deposited film. It is therefore necessary to remove the remaining unnecessary copper completely from the substrate before at least film deposition. Furthermore, copper deposited on the outer peripheral portion of the substrate other than the circuit formation area is not only unnecessary, but may cause cross contamination in subsequent processes of delivering, storing and processing the substrate. For these reasons, it is necessary that the remaining deposited copper on the peripheral portion of the substrate be completely removed immediately after the copper film deposition process or the CMP process.

Here, the outer peripheral portion of the substrate is defined as an area including an edge and a bevel of the substrate, or either the edge or the bevel. The edge of the substrate means areas of the front and back surfaces within about 5 mm from the outer peripheral end of the substrate, and the bevel of the substrate means an area of the outer peripheral end surface and a curved portion in a cross section within 0.5 mm from the outer peripheral end of the substrate.

There has been generally known an edge polisher for polishing a bare silicon wafer, but there has heretofore been no polishing apparatus for polishing only an outer peripheral portion of a substrate having a film formed thereon.

This kind of edge polisher for polishing a bare silicon wafer generally comprises a substrate holder and a polishing member. In the embodiment shown in FIG. 15, the substrate holder 304 is composed of a robot hand 302 which extends vertically and has a holding portion 300 at a lower end thereof, and is movable in vertical and horizontal directions. The substrate W such as a silicon wafer is held by the holding portion 300 of the robot hand 302 under vacuum in such a state that the substrate W is inclined with respect to the horizontal plane and the edge of the substrate W is externally exposed. The polishing member 312 comprises a cylindrical support member 306 and a polishing cloth 308, and has a polishing surface 310 which is formed by a surface of the polishing cloth 308 affixed on a side surface of the cylindrical support member 306. With this arrangement, while the edge of the substrate W is brought into contact with the polishing surface 310, at least one of the substrate holder 304 and the support member 306 is rotated, and the substrate W is simultaneously moved up and down along the polishing surface 310 by the substrate holder 304, thereby polishing the edge of the substrate W.

When the entire surface of the edge of the substrate W is polished by this kind of edge polisher, one side of the edge of the substrate W is polished, and then the substrate W is reversed and held again by the substrate holding member 304. Thereafter, the other side of the edge of the substrate W is polished.

Therefore, if the outer peripheral portion of the substrate having a film formed thereon is polished by the edge polisher for polishing a bare silicon wafer, this polishing work is required to be performed separately at a location different from the polishing work of the surface of the substrate. Thus, this polishing work is considerably troublesome. Further, in this kind of edge polisher, the outer peripheral portion of the substrate (workpiece) is polished while the outer peripheral portion of the substrate is brought into point contact with the polishing surface at a point along a circumferential direction of the substrate, and hence the polishing rate thereof is generally low and it takes much time to complete polishing.

SUMMARY OF THE INVENTION

The present invention has been made in view of the above drawbacks. It is therefore a first object of the present invention to provide a polishing apparatus and method which can perform quickly a polishing operation of an outer peripheral portion of a workpiece such as a substrate having a film (particularly metal film) formed thereon as a series of polishing operations accompanying a primary polishing work of a surface of a substrate, and which can polish the outer peripheral portion of the workpiece efficiently.

A second object of the present invention is to provide an outer periphery polishing apparatus, for polishing an outer peripheral portion of a substrate, which can polish the outer peripheral portion of the substrate efficiently and be of compact construction.

Here, a surface of a substrate means a surface of a workpiece such as a semiconductor wafer on which a film or interconnects are formed.

According to one aspect of the present invention, there is provided a polishing apparatus for polishing a workpiece, comprising: a surface polishing mechanism for polishing a surface of the workpiece, the surface polishing mechanism comprising a polishing table having a polishing surface, and a top ring for holding the workpiece and pressing the workpiece against the polishing surface of the polishing table; and an outer periphery polishing mechanism for polishing an outer peripheral portion of the workpiece.

According to the present invention, polishing of the outer peripheral portion of the workpiece can be quickly conducted by the outer periphery polishing mechanism disposed adjacent to the polishing table as a series of processes before or after a primary polishing of a surface of the workpiece is conducted by the polishing table.

In a preferred aspect of the present invention, the top ring is constructed such that the top ring is movable in a vertical direction and a horizontal direction, and the outer periphery polishing mechanism is disposed at a position to which the top ring is movable, and has an outer periphery polishing unit having an outer periphery polishing surface for polishing the outer peripheral portion of the workpiece by contacting the outer peripheral portion of the workpiece held by the top ring.

With the above arrangement, the workpiece is held by the top ring and pressed against the polishing table to thereby conduct a primary polishing of the workpiece, and then the outer peripheral portion of the workpiece is polished by pressing the outer peripheral portion of the workpiece against the outer periphery polishing surface while the workpiece is being held by the top ring. Thereafter, the polished workpiece is transferred to a next process. Further, the outer peripheral portion of the workpiece is polished by bringing the outer peripheral portion of the workpiece into contact with the outer periphery polishing surface over an entire length along a circumferential direction of the workpiece and by rotating the workpiece and the polishing surface relatively to each other, i.e. rotating at least one of the workpiece and the polishing surface. Thus, the outer peripheral portion of the workpiece can be polished efficiently at a low pressure.

In a preferred aspect of the present invention, the outer periphery polishing unit is rotatable about its own axis, and is provided with a polishing liquid supply port around a rotational center of the outer periphery polishing unit for supplying a polishing liquid to the outer periphery polishing surface by a centrifugal force caused by the rotation of the outer periphery polishing unit.

With this arrangement, the polishing liquid can be supplied to the outer periphery polishing surface from a position below the workpiece.

In a preferred aspect of the present invention, the workpiece comprises a substrate on which copper interconnects are formed.

In this case, the polishing liquid has a polishing rate for copper which is at least ten times greater than that for an oxide film or a low-K material.

In a preferred aspect of the present invention, the outer periphery polishing surface is upwardly inclined with respect to the horizontal plane in a radially outward direction.

In this case, the inclination angle of the polishing surface can be determined on the basis of the hardness of material constituting the outer periphery polishing surface, the shape of the outer peripheral portion of the substrate, the cutting width at the outer peripheral portion, or a pressing force applied to the workpiece during polishing so that the lower half, and a portion slightly thereabove, of the outer peripheral portion of the workpiece may be brought into contact with the outer periphery polishing surface or the cutting width of the outer periphery portion of the workpiece may be freely adjusted.

According to another aspect of the present invention, there is provided a polishing method for polishing a workpiece, comprising: polishing a surface of the workpiece by pressing the surface of the workpiece against a polishing surface of a polishing table under a predetermined force; and polishing an outer peripheral portion of the workpiece before or after the polishing of the surface of the workpiece.

According to still another aspect of the present invention, there is provided an outer periphery polishing apparatus for polishing an outer peripheral portion of a substrate, comprising: a substrate holder for holding the substrate so as to allow an outer peripheral portion of the substrate to be exposed externally; a polishing unit having a polishing surface located at a position facing the outer peripheral portion of the substrate held by the substrate holder; a rotating mechanism for rotating at least one of the substrate holder and the polishing unit; and a moving mechanism for moving at least one of the substrate holder and the polishing unit to bring the substrate holder and the polishing unit into engagement with each other and separate the substrate holder and the polishing unit from such engagement.

According to the present invention, the outer peripheral portion of the substrate is polished by bringing the outer peripheral portion of the substrate into contact with the outer periphery polishing surface over the entire length along the circumferential direction of the substrate and by rotating the substrate and the polishing surface relatively to each other. Thus, the outer peripheral portion of the substrate can be polished efficiently at a low pressure.

In a preferred aspect of the present invention, the polishing surface is upwardly inclined with respect to the plane formed by the substrate held by the substrate holder in a radially outward direction.

With this arrangement, the lower half, and a portion slightly thereabove, of the outer peripheral portion of the substrate can be brought into contact with the polishing surface, or the outer peripheral portion of the substrate can be polished at a desired cutting width. This inclination angle can be determined on the basis of the hardness of material constituting the polishing surface, the shape of the outer peripheral portion of the substrate, the cutting width at the peripheral portion, or a pressing force applied to the substrate during polishing.

The substrate holder may hold the substrate by attracting the central portion of the substrate in such a state that the surface of the substrate faces downwardly.

In a preferred aspect of the present invention, the polishing unit is rotatable about its own axis, and is provided with a polishing liquid supply port around a rotational center of the polishing unit for supplying a polishing liquid to the polishing surface by a centrifugal force caused by the rotation of the polishing unit.

Thus, the polishing liquid can be supplied to the polishing surface from a position below the substrate.

In a preferred aspect of the present invention, the substrate comprises a substrate on which copper interconnects are formed. The polishing liquid has a polishing rate for copper which is at least ten times greater than that for an oxide film or a low-K material.

In a preferred aspect of the present invention, the outer periphery polishing apparatus further comprises a pressing mechanism for pressing the outer peripheral portion of the substrate against the polishing surface of the polishing unit.

Thus, the outer peripheral portion of the substrate can be reliably pressed against the polishing surface of the polishing unit at a predetermined pressing force to thus prevent generation of a defective portion due to displacement of the substrate or random movement of the substrate.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 3 is an enlarged cross-sectional view showing a top ring and an outer periphery polishing unit for polishing an outer peripheral portion of a substrate shown in FIG. 1;

DETAILED DESCRIPTION OF THE PREFERRED EMBODIMENTS

A polishing apparatus and method according to embodiments of the present invention will be described below with reference to drawings.

Figure 1:
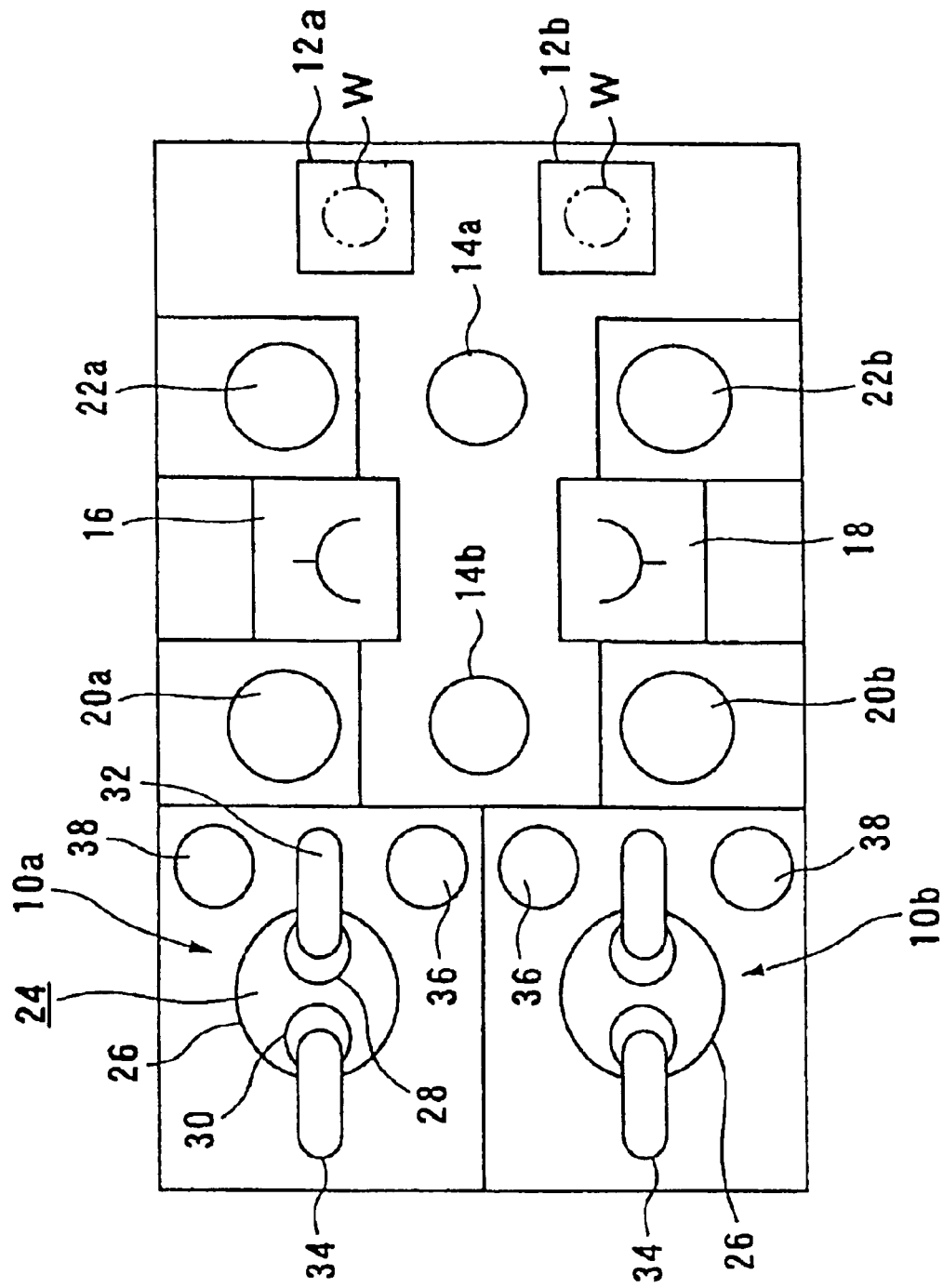
FIG. 1 is a plan view showing the whole structure of a polishing apparatus according to a first embodiment of the present invention.

FIG. 1 shows a layout of the whole structure of the polishing apparatus according to the first embodiment of the present invention. As shown in FIG. 1, a polishing apparatus comprises a pair of polishing units 10a, 10b positioned at one end of a rectangular floor space and spaced from each other in confronting relation to each other, and a pair of loading and unloading units positioned at the other end of the rectangular floor space and having respective wafer cassettes 12a, 12b spaced from the polishing units 10a, 10b in confronting relation thereto. The wafer cassettes 12a, 12b house copper interconnect substrates (workpieces to be polished) in which circuits are formed at areas except for outer peripheral portions of the respective substrates and copper is deposited on substantially entire surfaces of the respective substrates. Two transfer robots 14a, 14b are movably disposed along a line which extends between the polishing units 10a, 10b and the loading and unloading units, thereby providing a transfer line. The polishing apparatus also has a pair of reversing units 16, 18 disposed one on each side of the transfer line and two pairs of cleaning units 20a, 20b and 22a, 22b disposed one pair on each side of the transfer line. The reversing unit 16 is positioned between the cleaning units 20a and 22a, and the reversing unit 18 is positioned between the cleaning units 20b and 22b. Each of the reversing units 16, 18 serves to reverse a substrate such as a semiconductor wafer, i.e. turn the substrate over.

The polishing units 10a and 10b are of basically the same specifications, and are located symmetrically with respect to the transfer line. Each of the polishing units 10a, 10b constitutes a surface polishing mechanism and comprises a turntable 26 with a polishing cloth 24 attached to an upper surface thereof, a top ring 28 for holding a substrate W under vacuum and pressing the substrate W against the polishing cloth 24 on the upper surface of the turntable 26, and a dresser 30 for dressing the polishing cloth 24. The turntable 26 constitutes a polishing table, and the polishing cloth 24 has a surface constituting a polishing surface. The top ring 28 is supported at a free end of a swing arm 32, and the dresser 30 is supported at a free end of a swing arm 34. Thus, the top ring 28 and the dresser 30 are swingable in a horizontal plane, respectively.

Further, a pusher 36 which is vertically movable and transfers the substrate W to and from the top ring 28 is provided in each of the polishing units 10a, 10b at a position adjacent to the transfer line. A polishing unit 38 for polishing an outer peripheral portion of a substrate (hereinafter referred to as outer periphery polishing unit) constitutes with the top ring 28 an outer periphery polishing mechanism for polishing the outer peripheral portion of the substrate together, and is disposed at a position opposite the pusher 36 with respect to the turntable 26.

Figure 2:
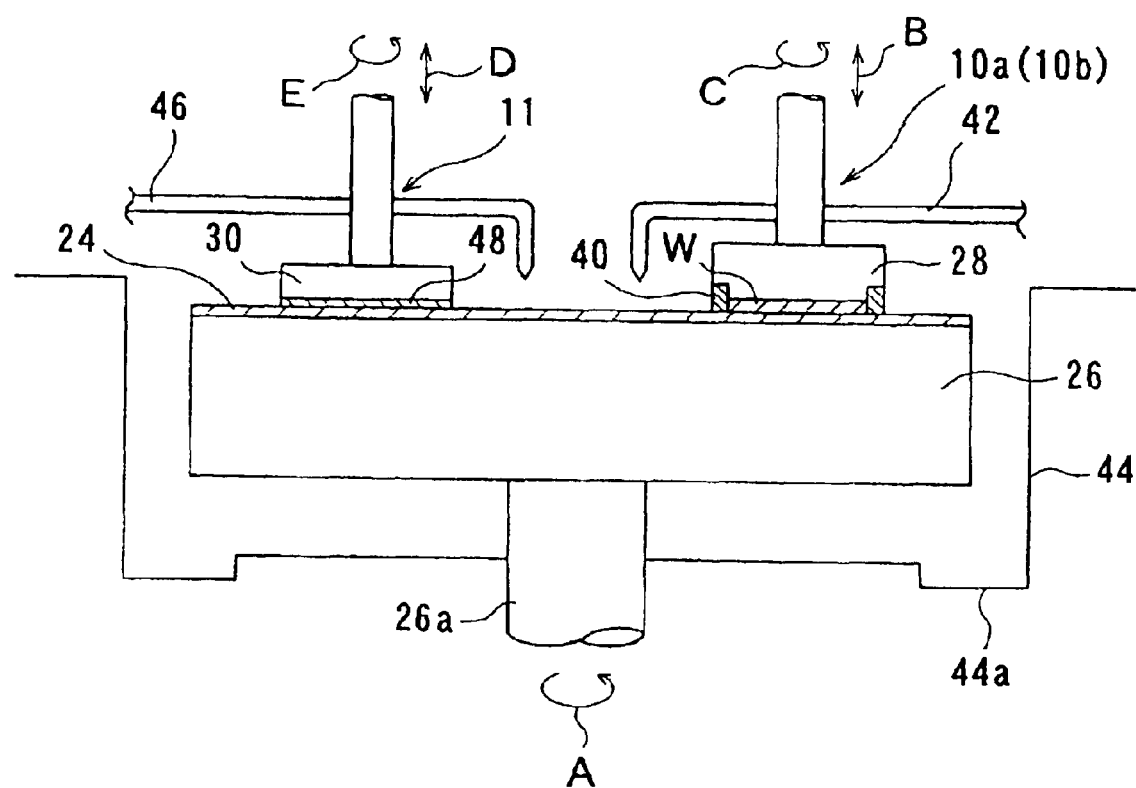
FIG. 2 is a cross-sectional view showing a polishing unit shown in FIG. 1.

FIG. 2 shows a detailed structure of the polishing unit 10a or 10b. As shown in FIG. 2, the turntable 26 is coupled to a motor (not shown) and is rotatable about its own axis 26a as indicated by the arrow A. The top ring 28 is coupled to a motor (not shown) and also to a lifting/lowering cylinder (not shown). The top ring 28 is vertically movable and rotatable about its own axis as indicated by the arrows B, C by the motor and the lifting/lowering cylinder. The top ring 28 can therefore press the substrate W against the polishing cloth 24 under a desired pressure. The substrate W is attached to a lower surface of the top ring 28 under vacuum or the like. A retainer ring (guide ring) 40 is mounted on the outer circumferential portion of the lower surface of the top ring 28 for preventing the substrate W from being dislodged from the top ring 28.

A polishing liquid supply nozzle 42 is disposed above the turntable 26 for supplying a polishing liquid containing abrasive particles onto the polishing cloth 24 attached to the turntable 26. A cover 44 is disposed around the turntable 26 for collecting the polishing liquid and water which are discharged from the turntable 26. The cover 44 has a gutter 44a formed at a lower portion thereof for draining the polishing liquid and water that have been discharged from the turntable 26.

The dresser 30 is positioned above the turntable 26 in diametrically opposite relation to the top ring 28, and can dress the polishing cloth 24. The polishing cloth 24 is supplied with a dressing liquid such as water from a dressing liquid supply nozzle 46 extending over the turntable 26. The dresser 30 is coupled to a motor (not shown) and also to a lifting/lowering cylinder (not shown). The dresser 30 is vertically movable and rotatable about its own axis as indicated by the arrows D, E by the motor and the lifting/lowering cylinder.

The dresser 30 is of a disk shape having substantially the same diameter as the top ring 28 and has a lower surface to which a dressing tool 48 is attached. The dresser 30 has a lower surface, i.e. a holding surface for holding the dressing tool 48, in which holes (not shown) are formed. These holes communicate with a vacuum source, and the dresser 30 holds the dressing tool 48 under vacuum. The polishing liquid supply nozzle 42 and the dressing liquid supply nozzle 46 extend to respective given positions near a rotation center of the turntable 26, and supply the polishing liquid, and the dressing liquid such as pure water, respectively.

In the above embodiment, although the polishing surface is composed of the polishing cloth, the polishing surface may be composed of a fixed abrasive pad in which abrasive particles are impregnated or fixed, or an abrading plate (grindstone).

FIG. 3 shows the top ring 28 and the outer periphery polishing unit 38 in detail. As shown in FIG. 3, the top ring 28 comprises a top ring body 50 and a holding plate 52 having a number of small holes extending vertically, and a chamber 54 is defined between the top ring body 50 and the holding plate 52. An elastic pad 56 is attached to a lower surface of the holding plate 52. With this arrangement, when the chamber 54 is evacuated by a vacuum source such as a vacuum pump, the substrate W is held by the lower surface of the holding plate 52 under vacuum with the elastic pad 56 being interposed therebetween. The substrate W is held by the top ring 28 in such a state that a circuit forming surface on which a film is formed is directed downwardly.

The retainer ring (guide ring) 40 is located at the outer periphery of the holding plate 52, and is vertically movable. When the retainer ring 40 is lowered as shown by solid lines to project downwardly from the lower surface of the holding plate 52, a recess for accommodating the substrate is defined in the top ring 28. When the retainer ring 40 is raised as shown by alternate long and two short dashes lines, the outer peripheral portion of the substrate W is exposed to the exterior. The top ring 28 is coupled to a lower end of a top ring shaft 62 through a ball joint 60, and the top ring shaft 62 is vertically movably and rotatably supported by the free end of the swing arm 32.

Figure 4:
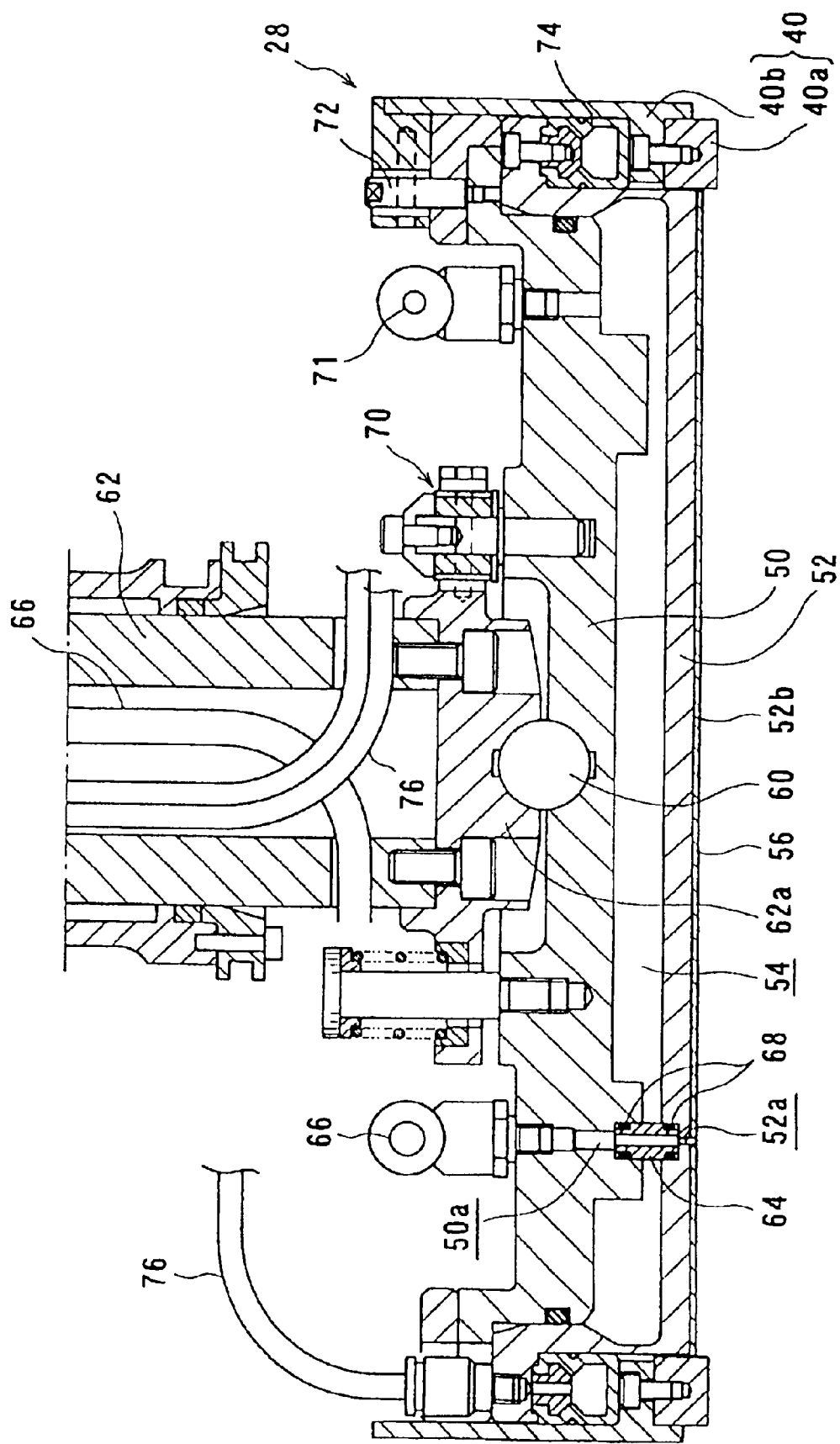
FIG. 4 is an enlarged cross-sectional view showing an essential part of the top ring shown in FIG. 1.
Figure 5A:
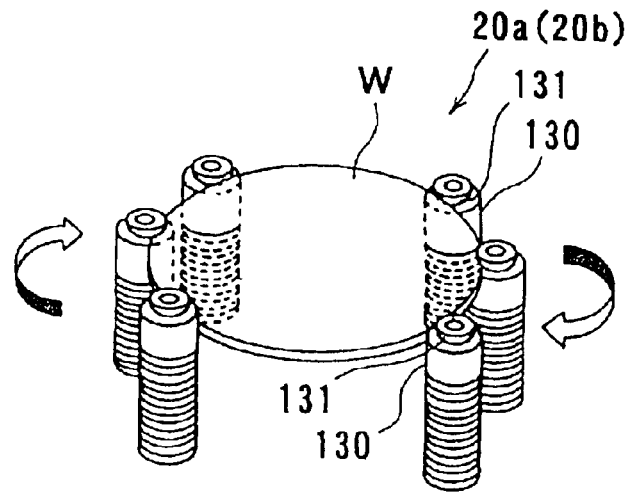
FIG. 5A is a perspective view showing a cleaning apparatus shown in FIG. 1.
Figure 5B:
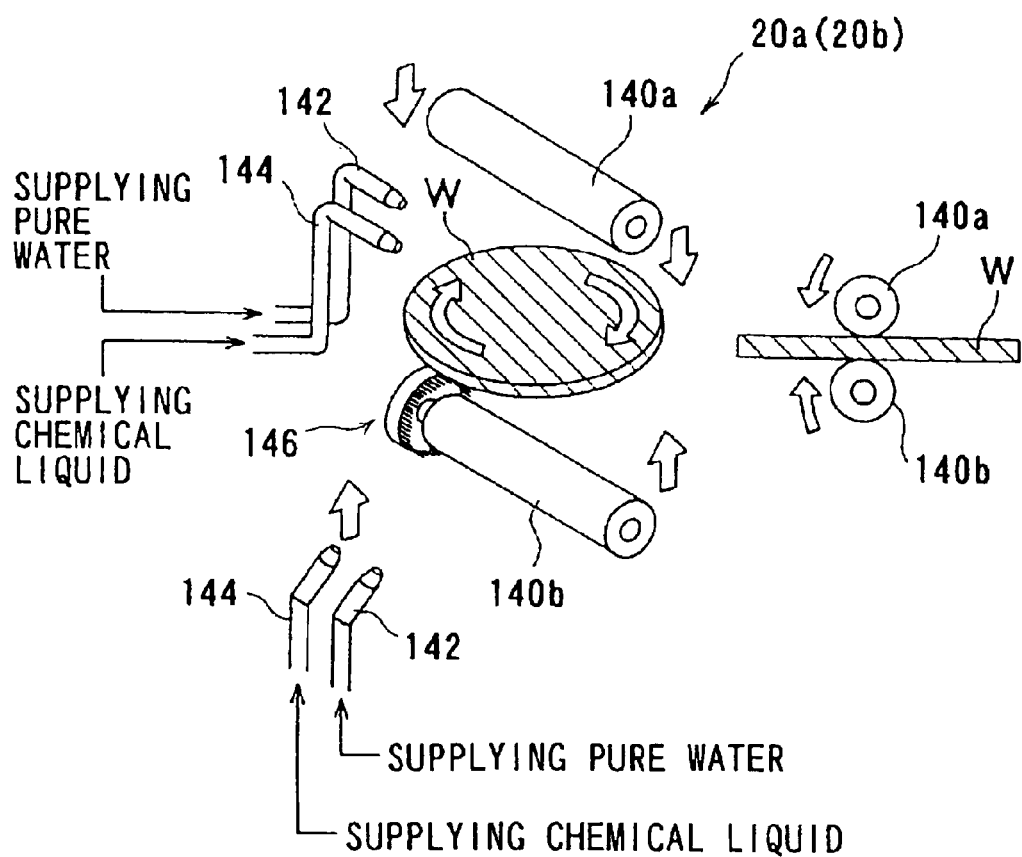
FIG. 5B is a schematic view showing the operation of the cleaning apparatus shown in FIG. 1.

FIG. 4 shows the top ring 28 in detail. As shown in FIG. 4, the holding plate 52 is provided with a plurality of communication holes 52a opening at the lower surface thereof. These communication holes 52a communicate with a vacuum source (not shown) such as a vacuum pump through joints 64, communication holes 50a formed in the top ring body 50, and tubes 66. Thus, the substrate holding surface 52b of the holding plate 52 holds the upper surface of the substrate W under vacuum.

Each of the joints 64 has a pair of O-rings 68 at upper and lower ends thereof to prevent the communication holes 50a and 52a from communicating with the chamber 54. The joint 64 is inserted into the holding plate 52 in a clearance fit so as not to prohibit the holding plate 52 from being deformed. The communication holes 52a are connected to a switching valve (not shown) through a tube 66 extending in the top ring shaft 62 and a rotary joint (not shown). By switching the switching valve, the communication holes 52a are allowed to communicate with the vacuum source, a pressurized air source, or a liquid source. Thus, the substrate W can be held by the holding surface 52b of the holding plate 52 by developing negative pressure lower than atmospheric pressure in the communication holes 52a by the vacuum source. Further, the backside pressure can be applied to the backside of the substrate W during polishing by ejecting a pressurized air through the communication holes 52a by the pressurized air source. Traces formed during transportation of the substrate W by the effect of vacuum attraction can be eliminated by slightly applying the backside pressure on the substrate W during polishing. The substrate W can be removed from the substrate holding surface 52b by ejecting liquid through the communication holes 52a by the liquid source.

The retainer ring 40 comprises a first retainer ring member 40a of resin material which is provided at the lowermost position and contacts the polishing cloth 24, and a second retainer ring member 40b having a L-shaped cross section which is provided on the first retainer ring member 40a and supports the first retainer ring member 40a. The second retainer ring member 40b is connected at its upper end to the top ring body 50 by pins 72 along a rotational direction so that the retainer ring 40 is rotatable together with the top ring 28. A fluid pressure bag 74 comprising an annular rubber tube is provided between the retainer ring 40 and the top ring 28. The fluid pressure bag 74 is fixed to the second retainer ring member 40b. The fluid pressure bag 74 is connected to a vacuum source, a pressurized air source, or a liquid source through a regulator (not shown). With this arrangement, the bag 74 is contracted by evacuating the interior of the bag 74 with the vacuum source to raise the retainer ring 40, and the bag 74 is expanded by pressurizing the interior of the bag 74 with the pressurized air source to lower the retainer ring 40.

The top ring shaft 62 has a drive flange 62a, and the rotation of the top ring shaft is transmitted to the top ring 28 through a transmitting mechanism 70 including a plurality of pins. Further, the chamber 54 is connected to the vacuum source or the pressurized air source through a tube 71 and a regulator (not shown).

On the other hand, as shown in FIG. 3, the outer periphery polishing unit 38 has a substantially circular support member 80, and a recess 80a having an inclined surface whose diameter is gradually increased upwardly is formed in the support member. The inclined surface is facing the outer peripheral portion of the substrate W. An annular polishing cloth 84 serving as a polishing surface 82 for polishing an outer peripheral portion of a substrate (hereinafter referred to as outer periphery polishing surface) is attached to the inclined surface of the recess 80a. With this arrangement, the outer periphery polishing surface 82 is upwardly inclined by an angle $\alpha$ with respect to the horizontal plane in a radially outward direction.

In case of the substrate such as a semiconductor wafer on which a circuit pattern is formed, the object of polishing is to remove metal film remaining on the front surface of the outer peripheral portion of the substrate, and hence, in the case of polishing the outer peripheral portion of the substrate, polishing of only the front surface of the substrate may be insufficient. Therefore, as shown in FIG. 3, a desired polishing of the outer peripheral portion of the substrate is performed by pressing the substrate against the outer periphery polishing surface 82 whose diameter is gradually increased upwardly in such a state that the surface of the substrate on which the circuit pattern is formed is directed downwardly.

Figure 14:
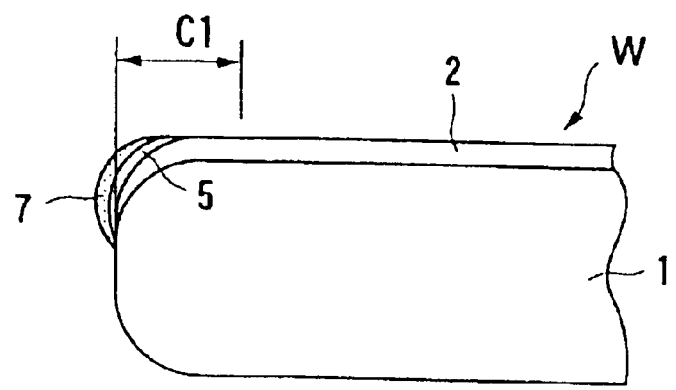
FIG. 14 is a cross-sectional view showing an outer peripheral portion of a substrate after the substrate having copper interconnects thereon is subjected to the CMP process.
Figure 15:
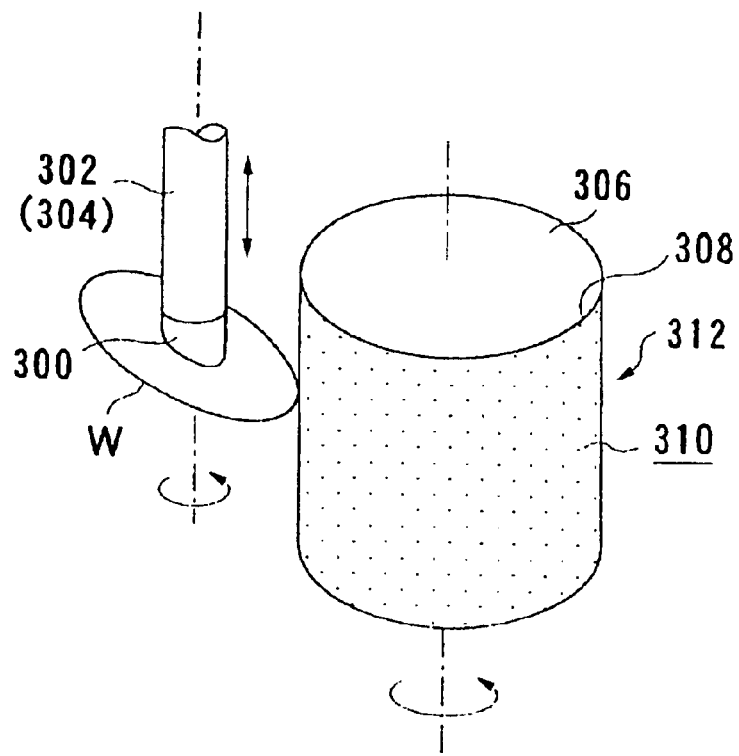
FIG. 15 is a schematic perspective view of a conventional edge polisher.

As the polishing cloth 84, for example, nonwoven fabric cloth such as SUBA 400 or SUBA 600 manufactured by Rodel Products Corporation, or an independent bubble pad (polyurethane form) such as IC 1000 manufactured by Rodel Products Corporation, or suede is used. By inclining the polishing cloth 84 at an angle α with respect the horizontal plane, the lower half and a portion of the outer peripheral portion of the substrate W that is slightly above the lower half may be brought into contact with the outer periphery polishing surface 82, or the cutting width $C_1$ (see FIG. 14) of the outer peripheral portion of the substrate may be set to a desired width. As the polishing cloth, a particularly soft polishing cloth such as Supreme RN manufactured by Rodel Products Corporation is suitable.

The angle α can be determined on the basis of the hardness of the material constituting the outer periphery polishing surface 82, the shape of the outer peripheral portion of the substrate W, the cutting width $C_1$ at the outer peripheral portion (see FIG. 14), or a pressing force applied to the substrate during polishing so that the lower half, and a portion slightly thereabove, of the outer peripheral portion of the substrate W may be brought in contact with the outer periphery polishing surface 82 or the cutting width $C_1$ may be freely adjusted. For example, by making the angle α smaller and selecting soft material for the outer periphery polishing surface 82, the cutting width $C_1$ may be set to about 5 mm or more to thus cope with the remaining deposited copper.

In this embodiment, the outer periphery polishing surface 82 is composed of a surface of the polishing cloth 84, and it is desirable to select soft material for the polishing cloth in order to prevent generation of scratches. However, the polishing surface may comprise a surface of a fixed abrasive (abrading plate) in which abrasive particles are impregnated or fixed. In this case, since the fixed abrasive is not deformed, the surface of the fixed abrasive is formed into a circular arc shape so as to correspond to the shape of the outer peripheral portion of the substrate.

The outer periphery polishing unit 38 is connected to an upper end of a shaft 86 which extends vertically and is rotatable. A polishing liquid passage 88 is formed in a central portion of the shaft 86 so as to extend vertically, and a polishing liquid supply port 90 is formed at a central portion of the support member 80 so as to communicate with the polishing liquid passage 88. With this arrangement, a polishing liquid 92 discharged from the polishing liquid supply port 90 is supplied to the outer periphery polishing surface 82 under a centrifugal force caused by the rotation of the outer periphery polishing unit 38. A cleaning liquid such as pure water or deionized water may be supplied to the polishing liquid supply port 90 through the polishing liquid passage 88. Alternatively, another line for supplying the cleaning liquid may be provided.

As a polishing liquid, a polishing liquid (slurry) containing abrasive particles is used. In the case where copper is removed and Ta is left, a polishing liquid such as EPC 5001 manufactured by Cabot Corporation whose polishing rate for copper is at least ten times greater than that for Ta is preferably used. In the case where copper and Ta are removed and an oxide film or a low-K material (low dielectric constant interlayer insulator film) is left, a polishing liquid whose polishing rate for copper and Ta is at least ten times greater than that for the oxide film or the low-K material is preferably used.

FIGS. 5A through 6B show the cleaning apparatus (cleaning unit) 20a or 20b which is a primary cleaning machine. As shown in FIGS. 5A through 6B, the cleaning apparatus 20a or 20b comprises a plurality of upstanding substrate-holding rollers 130 openably and closably disposed around the substrate W. The substrate-holding rollers 130 have holding grooves 131 defined in upper ends thereof for holding the edge of the substrate W and rotating the substrate W upon rotation of the rollers 130. A pair of roll type scrubbing cleaning members 140a, 140b is disposed in sandwiching relationship to the substrate W. The scrubbing cleaning members 140a, 140b are rotatable about respective axes thereof and movable into and out of contact with the substrate W. Around the scrubbing cleaning members 140a, 140b, there are provided pure water supply nozzles 142 for supplying pure water to upper and lower surfaces of the substrate W and chemical liquid supply nozzles 144 for supplying chemical liquid such as etching liquid to the upper and lower surfaces of the substrate W.

Figure 6A:
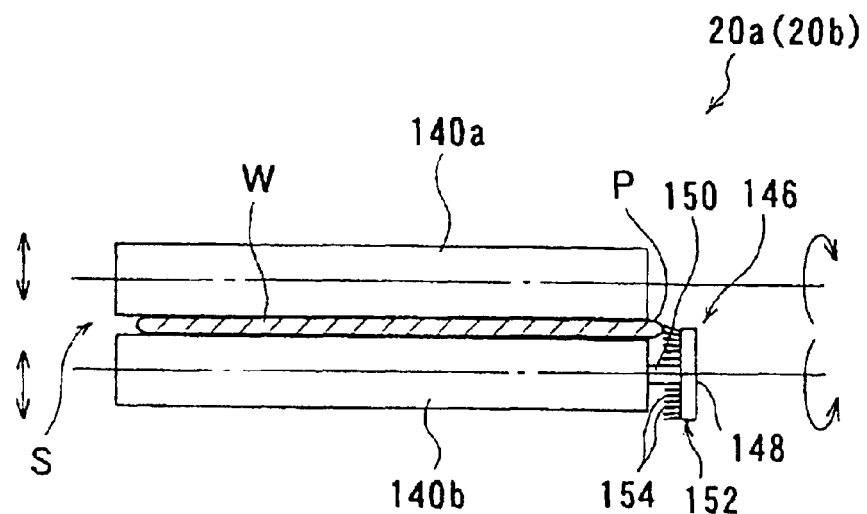
FIG. 6A is a front view showing the manner in which scrubbing cleaning is carried out by the cleaning apparatus shown in FIG. 1.
Figure 6B:
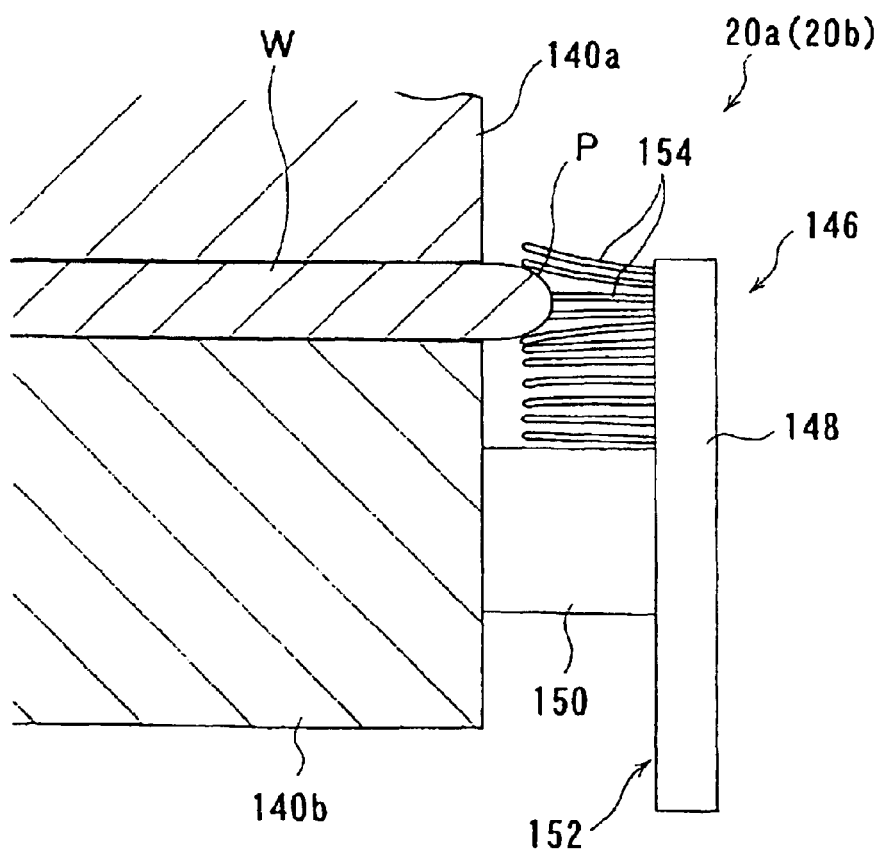
FIG. 6B is an enlarged cross-sectional view showing the manner in which scrubbing cleaning is carried out by the cleaning apparatus shown in FIG. 1.

In this embodiment, a mohair brush 146 constituting an outer peripheral portion cleaning member is provided at one end of the scrubbing cleaning member 140b located below the substrate W so as to be rotated integrally with the scrubbing cleaning member 140b. As shown in FIG. 6B, the mohair brush 146 comprises a support body 152 comprising a circular disk-shaped base portion 148 having a diameter larger than that of the scrubbing cleaning member 140b and a shaft 150, and a relatively large amount of mohair 154 which is provided on the base portion 148 at the side of the shaft 150 in a ring configuration and extends in an axial direction of the scrubbing cleaning member 140b.

The scrubbing cleaning members 140a, 140b are arranged such that the length and position of the scrubbing cleaning members 140a, 140b are set so as to expose the peripheral portion P of the substrate W at the side of the mohair brush 146. Further, when the scrubbing cleaning member 140b is brought into contact with the lower surface of the substrate W, the diameter of the base portion 148 and the length of the shaft 150 in the mohair brush 146 are set such that the mohair 154 is brought into contact with the entire surface of the peripheral portion P which projects outwardly from the free end surface of the scrubbing cleaning member 140b.

In this embodiment, although the outer peripheral portion cleaning member is composed of the mohair brush 146, the outer peripheral portion cleaning member may be composed of a brush made of other material, or PVA sponge, or urethane foam. Alternatively, the mohair brush may be provided on the end portion of the scrubbing cleaning member 140a adjacent to the upper surface of the substrate W.

Next, the polishing operation by the polishing apparatus according to this embodiment will be described below. In this embodiment, by providing the two polishing units 10a, 10b, two-stage polishing in a serial processing and a single-stage polishing in a parallel processing may be performed. Next, the parallel processing will be described, and only an upper processing route in the embodiment shown in FIG. 1 will be described.

First, the transfer robot 14a removes the substrate W from the wafer cassette 12a and conveys the substrate W to the reversing unit 16. The reversing unit 16 reverses the substrate W by rotating the substrate W through 180° to cause a surface to be polished to face downwardly. The transfer robot 14b receives the substrate W from the reversing unit 16, and transfers the substrate W to the pusher 36 in the polishing unit 10a.

In the polishing unit 10a, the top ring 28 receives the substrate W on the pusher 36 and holds the substrate W under vacuum, and the top ring 28 is swung to be positioned at a polishing position on the turntable 26.

In this state, the substrate W held by the top ring 28 is pressed against the polishing cloth 24 on the upper surface of the turntable 26. The turntable 26 and the top ring 28 are rotated relatively to each other for thereby bringing the lower surface of the substrate W in sliding contact with the polishing cloth 24. At this time, a slurry-like polishing liquid is supplied from the polishing liquid supply nozzle 42 to the polishing cloth 24. The lower surface of the substrate W is now polished by a combination of a mechanical polishing action of abrasive particles in the polishing liquid and a chemical polishing action of an alkaline solution in the polishing liquid. The polishing liquid which has been applied to polish the substrate W is scattered outwardly off the turntable 26 into the cover 44 under a centrifugal force caused by the rotation of the turntable 26, and collected by the gutter 44a in the lower portion of the cover 44.

At this time, the retainer ring 40 is lowered to prevent the substrate W from being dislodged from the lower surface of the top ring 28. In the case where the polishing cloth is used for polishing, polishing is conducted while a slurry containing abrasive particles is being supplied. In this case, the same slurry as a slurry used for polishing an outer peripheral portion of the substrate may be used. In the case where the abrading plate (fixed abrasive) is used for polishing, polishing is conducted while a polishing liquid containing no abrasive particles such as water or a mixture of water and chemical liquid is being supplied.

The polishing process comes to an end when a predetermined thickness of a surface layer is left or the surface layer is removed. When the polishing process is finished, the polishing properties of the polishing cloth 24 is changed and the polishing performance of the polishing cloth 24 deteriorates. Therefore, the polishing cloth 24 is dressed to restore its polishing properties by the dressing tool 48.

Specifically, while the dresser 30 holding the dressing tool 48 at a lower surface thereof and the turntable 26 are rotated, the dressing tool 48 is brought into contact with the polishing cloth 24 and pressed against the polishing cloth 24 under a certain pressure. At the same time when or immediately before the dressing tool 48 is brought into contact with the polishing cloth 24, a dressing liquid such as water is supplied from the dressing liquid supply nozzle 46 to the upper surface of the polishing cloth 24. The dressing liquid such as water is supplied to wash away the used polishing liquid remaining on the polishing cloth 24. Further, in the dressing process, the dressing tool 48 and the polishing cloth 24 are rubbed against each other to generate frictional heat, and hence the dressing liquid is also supplied to remove the frictional heat therefrom. The dressing liquid such as water supplied onto the polishing cloth 24 is scattered outwardly of the turntable 26 into the cover 44 under a centrifugal force caused by the rotation of the turntable 26, and collected by the gutter 44a in the lower portion of the cover 44.

After the polishing process is finished, the top ring 28 is raised, and the substrate W is swung to a position above the outer periphery polishing unit 38. At the same time, the retainer ring 40 is moved upwardly to expose the outer peripheral portion of the substrate W. In this state, while the outer periphery polishing unit 38 is rotated at a rotational speed of 20 to 1,000 rpm which is predetermined on the basis of the finish state, a polishing liquid 92 is discharged from the polishing liquid supply port 90 for thereby supplying the polishing liquid 92 to the outer periphery polishing surface 82 under a centrifugal force caused by the rotation of the outer periphery polishing unit 38. In this state, the top ring 28 is rotated at a rotational speed of, for example, 100 rpm in the same direction as the outer periphery polishing unit 38 and is lowered to bring the outer peripheral portion of the substrate W into contact with the outer periphery polishing surface 82. Then, the outer peripheral portion of the substrate W is pressed against the outer periphery polishing surface 82 under a predetermined pressing force of 50 kg (490 N) or lower, for example, thereby polishing the outer peripheral portion of the substrate W.

When the polishing process of the outer peripheral portion of the substrate W is finished, the top ring 28 is raised, and the substrate W is moved to a position above the pusher 36 and transferred to the pusher 36. Thereafter, the substrate W on the pusher 36 is received by the transfer robot 14b and transferred to the cleaning apparatus 20a. Specifically, the rollers 130 are positioned outwardly in the open position, and the scrubbing cleaning members 140a, 140b are positioned at respective upper and lower standby positions. In this state, the substrate W is conveyed to a predetermined position inwardly of the rollers 130, and then the rollers 130 are moved forward to hold the substrate W. In this state, while the substrate W is rotated horizontally at a low rotational speed of several tens to about 300 rpm by the rollers 130 and the scrubbing cleaning members 140a, 140b are rotated about their own axis, the scrubbing cleaning members 140a, 140b are moved from the standby positions toward the substrate W to contact the upper and lower surfaces of the substrate W. Further, while pure water is supplied from the pure water supply nozzles 142 to the upper and lower surfaces of the substrate W, the upper and lower surfaces of the substrate W are scrubbed with the scrubbing cleaning members 140a, 140b to thereby perform a scrubbing cleaning (primary cleaning).

At this time, the mohair brush 146 provided on the end portion of the scrubbing cleaning member 140b adjacent to the lower surface of the substrate W is rotated integrally with the scrubbing cleaning member 140b and is brought into contact with the peripheral portion P of the substrate W to thus conduct a scrubbing cleaning of the peripheral portion P of the substrate W. Since the substrate W is rotated horizontally by the rollers 130, the entire peripheral portion P of the substrate W is cleaned. Further, the peripheral portion P exposed to the exterior in FIG. 6A contacts the scrubbing cleaning members 140a, 140b at another position S to be thus cleaned sufficiently. Thus, the outer peripheral portion P (particularly the bevel) of the substrate W which has been polished is cleaned, and hence the polishing liquid and the ground-off material remaining on the outer peripheral portion of the substrate are removed to prevent them from generating particles at a subsequent stage.

Next, if necessary, an etching liquid is supplied from the chemical liquid supply nozzles 144 to the upper and lower surfaces of the substrate W while the rotational speed of the substrate W is being changed. Thus, the surfaces of the substrate W are subjected to the etching (chemical cleaning) to remove metal ions remaining on the surfaces of the substrate W, and then pure water is supplied from the pure water supply nozzles 142 to the surfaces of the substrate W to replace the etching liquid with pure water and remove the etching liquid. In this manner, in the cleaning apparatus 20a, both surfaces of the polished substrate W are cleaned at a first stage cleaning, and then the outer peripheral portion (particularly the bevel) of the substrate W is cleaned. Then, the cleaned substrate W is transferred to the reversing unit 16 by the transfer robot 14b, and the substrate W which has been reversed by the reversing unit 16 is transferred to the cleaning apparatus 22a by the transfer robot 14a. In the cleaning apparatus 22a, for example, pure water is ejected from the pure water rinse nozzles to conduct a second stage cleaning (finish cleaning), and then the substrate W is spin-dried by rotating the substrate W at a high speed. After the substrate W is spin-dried, the substrate W is returned to the wafer cassette 12a by the transfer robot 14a.

In this embodiment, although one side of the outer peripheral portion of the substrate W is polished, after one side of the outer peripheral portion of the substrate W is polished, the substrate may be reversed, and then the other side of the substrate W may be polished to polish the entire surface of the outer peripheral portion of the substrate W.

Further, in this embodiment, the outer peripheral portion of the substrate is polished after the surface of the substrate W is polished by the chemical mechanical polishing (CMP). However, the outer peripheral portion of the substrate may be polished before chemical mechanical polishing of the surface of the substrate W, and then the surface of the substrate W may be polished by the CMP. Particularly, if the polished residue removed from the substrate affects polishing of the film on the surface of the substrate, the outer peripheral portion of the substrate may be polished, and then the surface layer of the substrate may be planalized.

Figure 7:
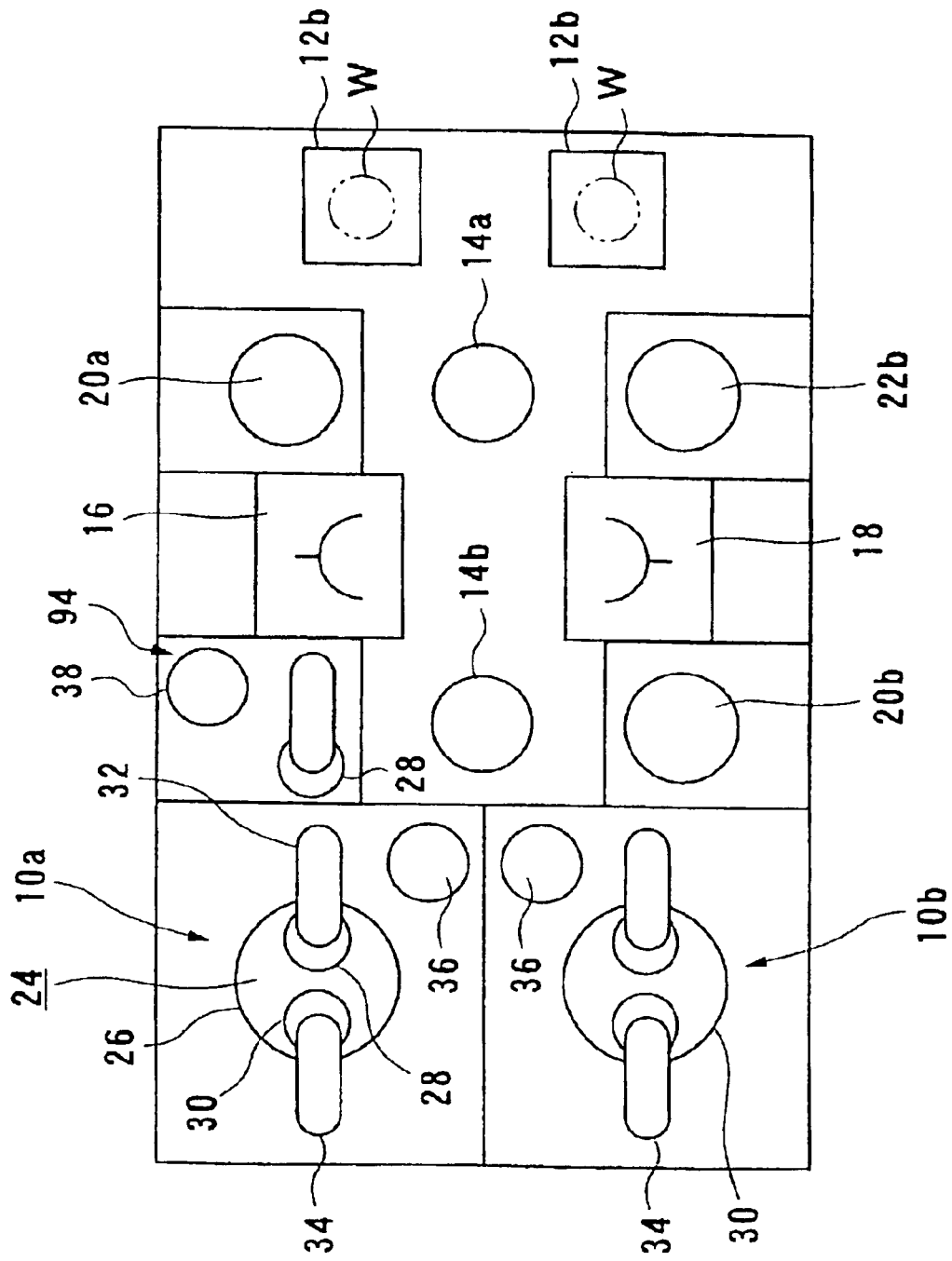
FIG. 7 is a plan view showing the whole structure of the polishing apparatus according to a second embodiment of the present invention.

FIG. 7 shows a layout of the whole structure of the polishing apparatus according to the second embodiment of the present invention. As shown in FIG. 7, in this polishing apparatus, an outer periphery polishing unit 38 having the same structure as the outer periphery polishing unit 38 shown in FIG. 3 is disposed at the position where the cleaning apparatus 20a shown in FIG. 1 has been disposed, and the top ring 28 having the same structure as that in the first embodiment is disposed adjacent to the outer periphery polishing unit 38. The outer periphery polishing unit 38 and the top ring 28 jointly construct an outer periphery polishing mechanism 94 for polishing an outer peripheral portion of the substrate W.

According to this embodiment, the outer peripheral portion of the substrate W is polished by the outer periphery polishing mechanism 94, and then the surface of the substrate W is polished by the turntable 26. Thereafter, the substrate W is returned to the wafer cassette 12a through the cleaning and drying processes. Alternatively, the surface of the substrate W is polished by the turntable 26, then the outer peripheral portion of the substrate W is polished by the outer periphery polishing mechanism 94, and then the substrate W is returned to the wafer cassette 12a through the cleaning and drying processes.

As described above, according to the polishing apparatus of the present invention, polishing of the outer peripheral portion of the workpiece can be quickly conducted by the outer periphery polishing mechanism disposed adjacent to the turntable, as a series of processes before or after primary polishing of the surface of the workpiece is conducted by the turntable. Further, the outer peripheral portion of the workpiece is polished by bringing the outer peripheral portion of the workpiece into contact with the outer periphery polishing surface over the entire length along the circumferential direction of the workpiece and by rotating at least one of the workpiece and the polishing surface. Thus, the outer peripheral portion of the workpiece can be polished efficiently at a low pressure.

Figure 8:
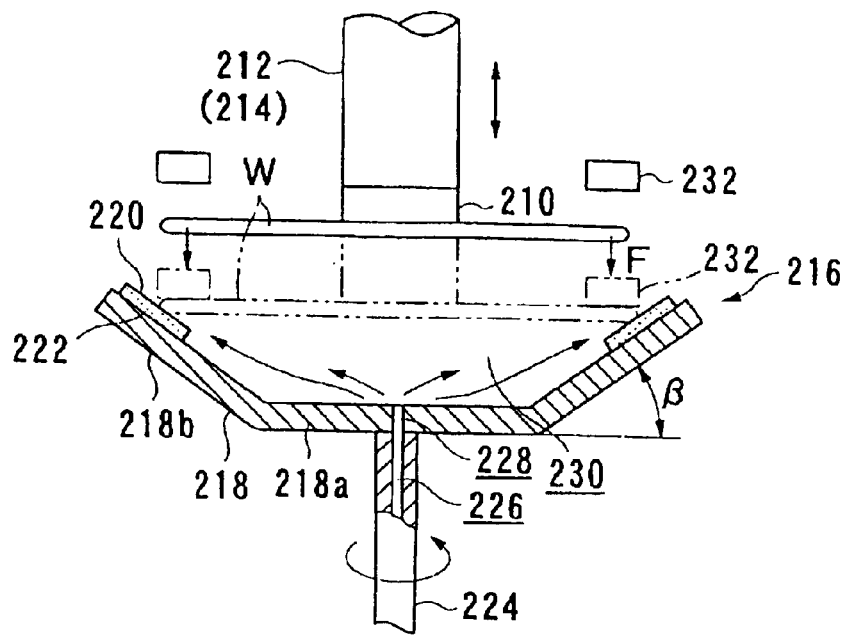
FIG. 8 is a vertical cross-sectional view showing an outer periphery polishing apparatus for polishing an outer peripheral portion of a substrate according to another embodiment of the present invention.

FIG. 8 shows a polishing apparatus for polishing an outer peripheral portion of the substrate (hereinafter referred to as outer periphery polishing apparatus) according to another embodiment of the present invention. The outer periphery polishing apparatus comprises a substrate holder and a polishing unit. In the embodiment, the substrate holder 214 is composed of a robot hand 212 which extends vertically and has a holding portion 210 at a lower end thereof, and is movable in a vertical direction and a horizontal direction. The substrate holder 214 holds the substrate W by attracting the central upper surface of the substrate under vacuum in such a state that the substrate is horizontally held and the circuit formation surface is directed downwardly. The polishing unit 216 is disposed below the substrate holder 214.

The polishing unit 216 has a support member 218 comprising a central flat portion 218a and an inclined portion 218b extending radially outwardly from the central flat portion 218a and inclined gradually upwardly. A ring-shaped polishing cloth 222 having a surface constituting a polishing surface 220 is attached to the inclined portion 218b of the support member 218 at a location facing the outer peripheral portion of the substrate W held by the substrate holder 214. Thus, the polishing surface 220 is inclined with respect to the horizontal plane by an angle $\beta$.

As the polishing cloth 222, for example, a nonwoven fabric cloth such as SUBA 400 or SUBA 600 manufactured by Rodel Products Corporation, or an independent bubble pad (polyurethane form) such as IC 1000 manufactured by Rodel Products Corporation, or suede is used. By inclining the polishing cloth 222 at an angle $\beta$ with respect to the horizontal plane, the lower half, and a portion slightly thereabove, of the outer peripheral portion of the substrate W may be brought into contact with the polishing surface 220.

The angle $\beta$ can be determined on the basis of the hardness of material constituting the polishing surface 220, the shape of the outer peripheral portion of the substrate W, or the cutting width $C_1$ at the outer peripheral portion (see FIG. 14) so that the lower half, and a portion slightly thereabove, of the outer peripheral portion of the substrate W may be brought into contact with the outer periphery polishing surface 220.

In this embodiment, the polishing surface 220 is composed of a surface of the polishing cloth 222, and it is desirable to select soft material for the polishing cloth in order to prevent generation of scratches. However, the polishing surface may comprise a surface of a fixed abrasive (abrading plate) in which abrasive particles are impregnated or fixed. In this case, since the fixed abrasive is not deformed, the surface of the fixed abrasive is formed into a circular arc shape so as to correspond to the shape of the outer peripheral portion of the substrate.

The polishing unit 216 is connected to an upper end of a shaft 224 which extends vertically and is rotatable. A polishing liquid passage 226 is formed in a central portion of the shaft 224 so as to extend vertically, and a polishing liquid supply port 228 is formed at a central portion of the support member 218 so as to communicate with the polishing liquid passage 226. With this arrangement, a polishing liquid 230 discharged from the polishing liquid supply port 228 is supplied to the polishing surface 220 under a centrifugal force caused by the rotation of the polishing unit 216. A cleaning liquid such as pure water or deionized water may be supplied to the polishing liquid supply port 228 through the polishing liquid passage 226. Alternatively, another line for supplying the cleaning liquid may be provided.

At a position above the polishing unit 216 and facing the polishing surface 220, there are provided a plurality of vertically movable pressing members 232 as a pressing mechanism for pressing the outer peripheral portion of the substrate W against the polishing surface 220 under a predetermined pressing force F while preventing the substrate from being defectively polished due to displacement or random movement of the substrate W.

Next, the operation of the outer periphery polishing apparatus according to this embodiment will be described below.

First, the substrate W is held under vacuum by the robot hand 212 (substrate holder 214) having the holding portion 210, and the substrate W is conveyed to a position immediately above the polishing unit 216 and below the pressing members 232 positioned at a raised position. Then, the polishing unit 216 is rotated at a rotational speed of, for example, 20 to 1,000 rpm which is predetermined on the basis of the finish state, and a polishing liquid 230 is simultaneously discharged from the polishing liquid supply port 228. Thus, the polishing liquid 230 is supplied to the polishing surface 220 under a centrifugal force caused by the rotation of the polishing unit 216.

In this state, the robot hand 212 is lowered to bring the outer peripheral portion of the substrate W into contact with the polishing surface 220, and then the pressing members 232 are lowered to press the outer peripheral portion of the substrate W against the polishing surface 220 under a predetermined pressing force F. Thus, one side of the outer peripheral portion of the substrate W is polished while the substrate W is prevented from being displaced or randomly moved. After polishing of the substrate is finished, if polishing of one side of the outer peripheral portion of the substrate W is sufficient, the pressing members 232 are raised and the robot hand 212 is also raised, and the polished substrate W is transported to a next process by the robot hand 212. If both sides of the outer peripheral portion of the substrate W are polished, one side of the outer peripheral portion of the substrate W is polished, and then the substrate W is reversed. Thereafter, the other side of the outer peripheral portion of the substrate W is polished by holding the substrate W with the robot hand 212 again, and then the polished substrate W is transported to a next process by the robot hand 212.

In this embodiment, although the polishing unit 216 is rotated, the substrate holder 214 may be rotated or both of the polishing unit 216 and the substrate holder 214 may be rotated. Further, as a mechanism for bringing the substrate holder 214 and the polishing unit 216 into contact with each other or separating the substrate holder 214 and the polishing unit 216 from each other, a mechanism for vertically moving the substrate holder 214 is employed. However, a mechanism for vertically moving the polishing unit 216 may be provided. Further, although the robot hand 212 serves as the substrate holder 214, a dedicated substrate holder may be provided to transfer the substrate between the dedicated substrate holder and the robot hand.

Figure 9:
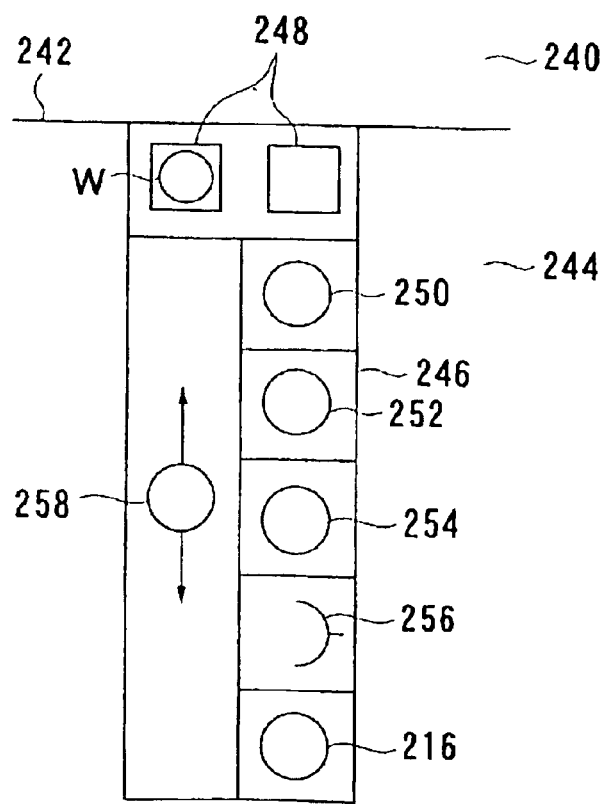
FIG. 9 is a schematic plan view showing a substrate processing apparatus having the outer periphery polishing apparatus shown in FIG. 8.
Figure 10:
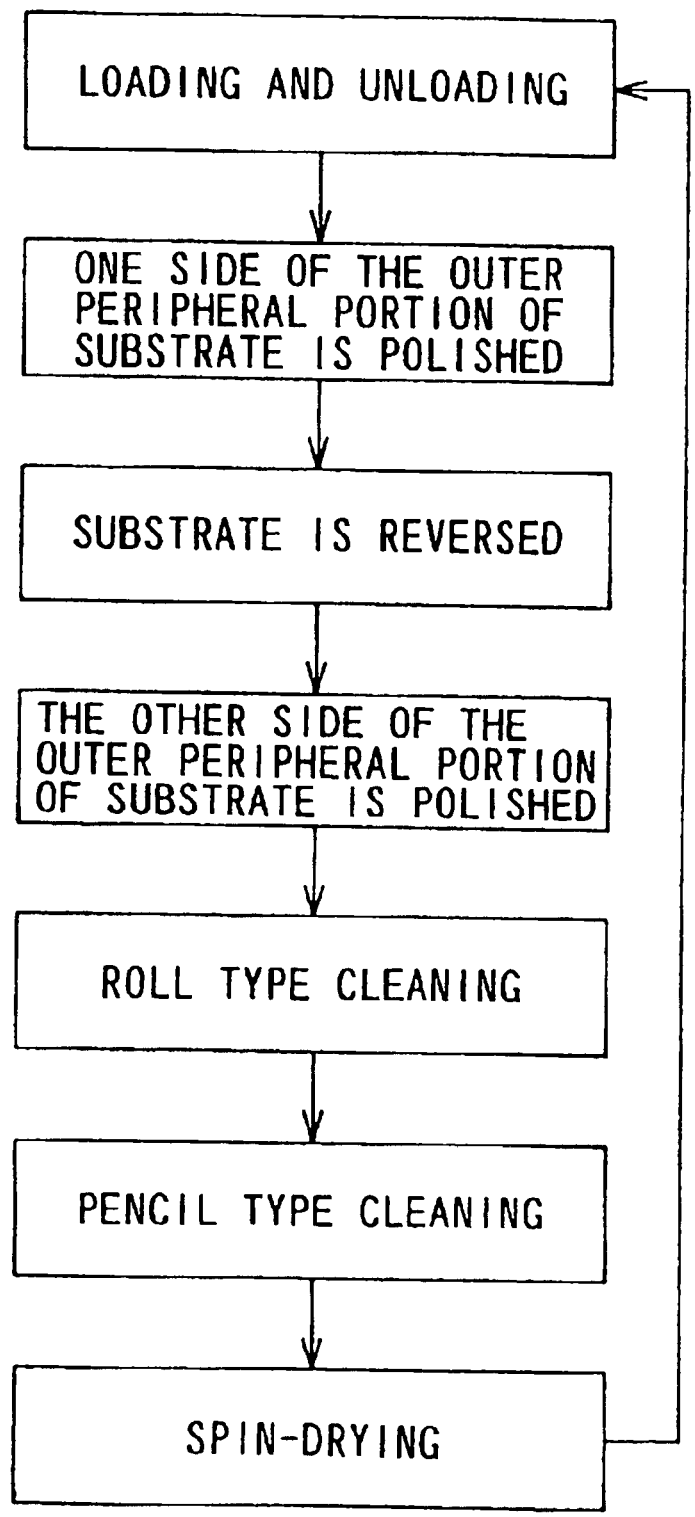
FIG. 10 is a flow chart showing processes of processing a substrate by the substrate processing apparatus shown in FIG. 9.

FIG. 9 is a plan view showing a substrate processing apparatus having the outer periphery polishing apparatus shown in FIG. 8, and FIG. 10 is a flow chart showing processes of processing the substrate by the substrate processing apparatus shown in FIG. 9.

As shown in FIG. 9, a housing 246, having a cover for covering its whole area, to which an exhaust duct is attached is provided in a utility zone 244 partitioned from a working zone 240 in a clean room by a partition plate 242. Two loading and unloading units 248 are disposed in the housing 246 at the side of the working zone 240. A spin-drying apparatus 250, a pencil type cleaning apparatus 252, a roll type cleaning apparatus 254, a reversing unit 256, and the polishing unit 216 constituting the outer periphery polishing apparatus are disposed in series along one of the side walls of the housing 246, and a movable robot 258 is disposed along the other of side walls of the housing 246. The robot hand of the robot 258 serves as the substrate holder in the outer periphery polishing apparatus.

In this substrate processing apparatus, as shown in FIG. 10, a substrate W to be polished is taken out from the loading and unloading unit 248 by the robot hand of the robot 258, and transferred to the polishing unit 216. In the polishing unit 216, one side of the outer peripheral portion of the substrate is polished in the same manner as the above, and then the substrate W whose one side of the outer peripheral portion has been polished is transferred to the reversing unit 256 by the robot 258. Thereafter, the substrate is reversed by the reversing unit 256, and then the substrate W is transferred again to the polishing unit 216, and the other side of the outer peripheral portion of the substrate is polished in the polishing unit 216.

Next, the substrate W whose entire peripheral portion has been polished is transferred to the roll type cleaning apparatus 254 by the robot 258, and the substrate W is cleaned by the roll type cleaning members. Thereafter, the substrate W is transferred to the pencil type cleaning apparatus 252, and cleaned by a pencil type cleaning member. Thereafter, the substrate W is transferred to the spin-drying apparatus 250 by the robot 258, and spin-dried by the spin-drying apparatus 250, and then the cleaned and dried substrate W is returned to the loading and unloading unit 248 by the robot 258.

In this manner, all devices or units of the polishing apparatus are covered and are disposed in the housing 246 to which the exhaust duct (not shown) is attached, and hence the polishing apparatus can be installed in the clean room having a level of class 1,000 or lower.

In order to increase throughput of the substrates W, it may be better to provide two robots, i.e. a first robot which is moved between the loading and unloading unit 248 and the roll type cleaning apparatus 254, and a second robot which is moved between the polishing unit 216 and the roll type cleaning apparatus 254. The first robot serves to remove the substrate W from the loading and unloading unit 248, and to transfer the substrate W between the roll type cleaning apparatus 254, the pencil type cleaning apparatus 252 and the spin-drying apparatus 250 so as to clean and dry the polished substrate W, and further to transfer the cleaned and dried substrate W to the loading and unloading unit 248. The second robot serves to transfer the substrate W between the roll type cleaning apparatus 254, the reversing unit 256 and the polishing unit 216 so as to reverse the substrate W and polish the outer peripheral portion of the substrate W, and clean the substrate W. At this time, the transfer of the substrate W between the first and second robots is performed through the roll type cleaning apparatus 254, but may be performed at a position of the reversing unit 256.

In the above embodiment, the entire surface of the outer peripheral portion of the substrate is polished by the single polishing unit. However, if it is necessary to increase the throughput of the substrates, two polishing units may be provided, and one side of the outer peripheral portion of the substrate may be polished by one of the polishing units, and the other side of the outer peripheral portion of the substrate may be polished by the other of the polishing units. Further, cleaning of the substrate may be performed using chemical liquids.

Figure 11:
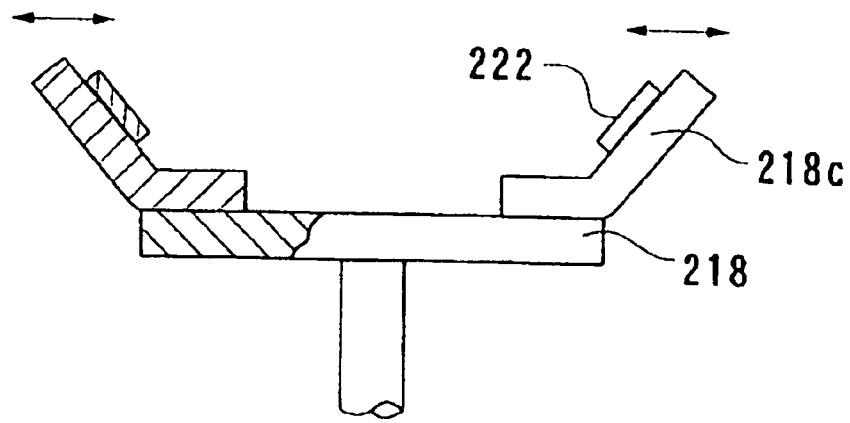
FIG. 11 is a vertical cross-sectional view showing an outer periphery polishing apparatus according to a further embodiment of the present invention.

FIG. 11 shows an outer periphery polishing apparatus according to a further embodiment of present invention. In this outer periphery polishing apparatus, a polishing cloth supporting portion 218c is provided on the peripheral portion of a supporting member 218 so as to allow the polishing cloth supporting member 218c to move horizontally. Further, the polishing cloth 222 is attached to the upper surface of the polishing cloth supporting member 218c. Thus, the outer periphery polishing apparatus can cope with the variation of the size of the substrate W.

Figure 12:
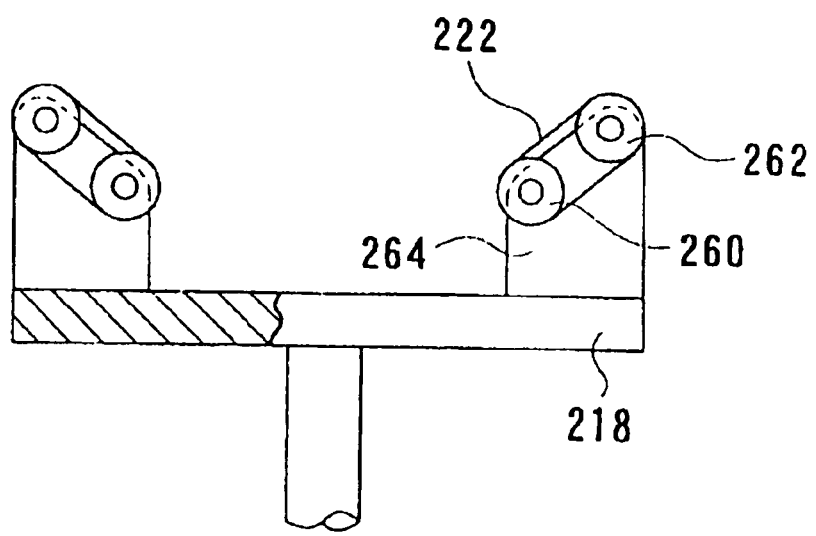
FIG. 12 is a vertical cross-sectional view showing an outer periphery polishing apparatus according to yet another embodiment of the present invention.
Figure 13A:
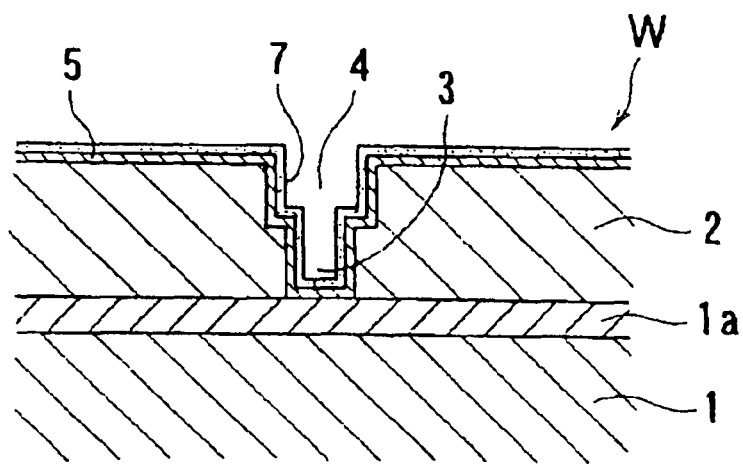
FIGS. 13A through 13C are cross-sectional views showing manufacturing processes of copper interconnects on the substrate.
Figure 13B:
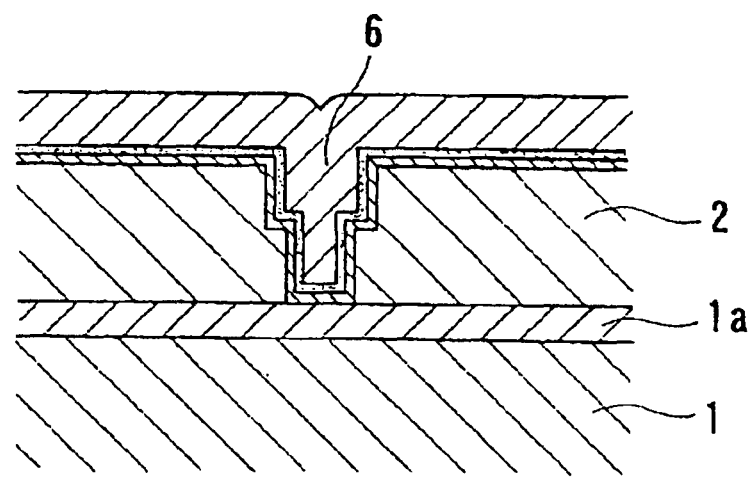
Figure 13C:
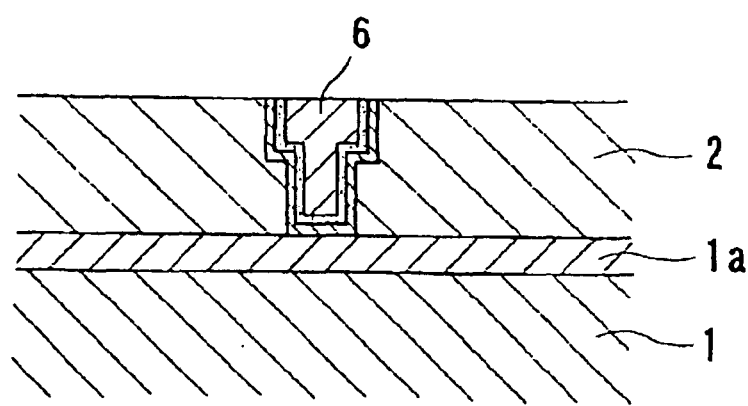

FIG. 12 shows an outer periphery polishing apparatus according to yet another embodiment of the present invention. In this outer periphery polishing apparatus, a plurality of brackets 264 are spacedly provided on the supporting member 218, and a pair of drive roller 260 and driven roller 262 is supported on each of the brackets 264. An endless polishing cloth 222 is provided between the two rollers 260 and 262 provided on the bracket 264. With this arrangement, since the polishing cloth 222 is movable, the entire surface of the polishing cloth 222 can be used.

A dressing tool comprising diamond, brush, or compressed fluid may be provided to prolong the life of the polishing cloth.

As described above, according to the outer periphery polishing apparatus of the present invention, the outer peripheral portion of the substrate is polished by bringing the outer peripheral portion of the substrate into contact with the outer periphery polishing surface over the entire length along the circumferential direction of the substrate and by rotating at least one of the substrate and the polishing surface. Thus, the outer peripheral portion of the substrate can be polished efficiently at a low pressure. Further, by utilizing a substantially flat plate-like polishing unit, the apparatus can be compact in size.

Although certain preferred embodiments of the present invention have been shown and described in detail, it should be understood that various changes and modifications may be made therein without departing from the scope of the appended claims.

What is claimed is:

1. A polishing method for polishing a workpiece, comprising:
   polishing a surface of a workpiece by pressing said surface of said workpiece against a polishing surface of a polishing table under a predetermined force;
   polishing an outer peripheral portion of said workpiece before or after said polishing of said surface of said workpiece by pressing said outer peripheral portion of said workpiece against an outer periphery polishing surface of a rotating outer periphery polishing unit; and
   directing a polishing liquid to said rotating outer periphery polishing unit about a rotational center thereof such that said polishing liquid is supplied to said outer periphery polishing surface via centrifugal force caused by the rotation of said outer periphery polishing unit.

2. The polishing method according to claim 1, wherein pressing said surface of said workpiece against said polishing surface comprises holding said workpiece with a top ring and pressing said workpiece against said polishing surface via said top ring.

3. The polishing method according to claim 2, wherein polishing said outer peripheral portion said workpiece comprises holding said workpiece with said top ring and pressing said outer peripheral portion of said workpiece against said outer periphery polishing surface of said rotating outer periphery polishing unit.

4. The polishing method according to claim 1, wherein said workpiece comprises a substrate on which copper interconnects are formed.

5. The polishing method according to claim 4, wherein said polishing liquid has a polishing rate for copper which is at least ten times greater than that for an oxide film or a low-K material.

6. A polishing method for polishing a workpiece having a film formed thereon, said polishing method comprising:
   polishing a surface of a workpiece by pressing said surface of said workpiece against a polishing surface of a polishing table under a predetermined force;
   polishing an outer peripheral portion of said workpiece before or after said polishing of said surface of said workpiece by pressing said outer peripheral portion of said workpiece against an outer periphery polishing surface of a rotating outer periphery polishing unit; and
   directing a polishing liquid to said rotating outer periphery polishing unit about a rotational center thereof such that said polishing liquid is supplied to said outer periphery polishing surface via centrifugal force caused by the rotation of said outer periphery polishing unit.

7. A polishing method for polishing a workpiece, comprising:
   holding a workpiece with a top ring and pressing a surface of said workpiece against a polishing surface of a polishing table so as to polish said surface of said workpiece; and
   holding said workpiece by said top ring while polishing an outer peripheral portion of said workpiece before or after the polishing of said surface of said workpiece by pressing said outer peripheral portion of said workpiece against an outer periphery polishing surface provided so as to substantially surround said outer peripheral portion of said workpiece.

* * * * *